(12) United States Patent
Kang

(10) Patent No.: US 6,781,863 B2
(45) Date of Patent: Aug. 24, 2004

(54) NONVOLATILE FERROELECTRIC MEMORY CONTROL DEVICE

(75) Inventor: Hee Bok Kang, Daejeon (KR)

(73) Assignee: Hynix Semicondutor Inc., Ichon-shi (KR)

( * ) Notice: Subject to any disclaimer, the term of this patent is extended or adjusted under 35 U.S.C. 154(b) by 0 days.

(21) Appl. No.: 10/331,350

(22) Filed: Dec. 31, 2002

(65) Prior Publication Data

US 2004/0042251 A1 Mar. 4, 2004

(30) Foreign Application Priority Data

Aug. 30, 2002 (KR) .................................. 10-2002-0051931

(51) Int. Cl.$^7$ ............................................. G11C 11/22
(52) U.S. Cl. .................. 365/145; 365/201; 365/189.08
(58) Field of Search ........................... 365/145, 189.06, 365/189.11, 230.11, 201, 209, 189.08, 230.01

(56) References Cited

U.S. PATENT DOCUMENTS 5,912,849 A * 6/1999 Yasu et al. .................. 365/195

* cited by examiner

*Primary Examiner*—Thong Q. Le
(74) *Attorney, Agent, or Firm*—Jacobson Holman PLLC

(57) ABSTRACT

The disclosed nonvolatile ferroelectric memory control device is configured to control an internal memory dump when a ferroelectric memory is used as an internal memory in a SOC (system on a chip) structure. In order to normally process internal memory data in normal and dump modes, dump mode control circuits comprise FRAM code cells, and external memory regions are allotted to internal memory regions so that all internal addresses may use ports normally. As a result, operation characteristics can be changed in the SOC structure by using a software way.

31 Claims, 11 Drawing Sheets

NONVOLATILE FERROELECTRIC MEMORY CONTROL DEVICE

BACKGROUND OF THE DISCLOSURE

1. Field of the Disclosure

The present invention relates to nonvolatile ferroelectric memory control devices, and more particularly, to a nonvolatile ferroelectric memory control device configured to control an internal memory dump when a ferroelectric memory is used for internal memory in a SOC (system on a chip) structure.

2. Description of the Related Art

Generally, a ferroelectric random access memory (hereinafter, referred to as 'FRAM') has attracted considerable attention as a next generation memory device because it has a data processing speed as fast as a Dynamic Random Access Memory DRAM and conserves data even after the power is turned off.

The FRAM includes capacitors similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a, hysteresis loop of a general ferroelectric substance.

As shown in FIG. 1, a polarization induced by an electric field does not vanish but remains at a certain portion ('d' or 'a' state) even after the electric field is cleared due to existence of a residual (or spontaneous) polarization. These 'd' and 'a' states may be matched to binary values of '1' and '0' for use as a memory cell.

FIG. 2 is a structural diagram illustrating a unit cell of the FRAM device.

As shown in FIG. 2, the unit cell of the conventional FRAM is provided with a bitline B/L arranged in one direction and a wordline W/L arranged in another direction vertical to the bitline B/L. A plateline P/L is arranged parallel to the wordline and spaced at a predetermined interval.

The unit cell is also provided with a transistor T1 having a gate connected to an adjacent wordline W/L and a source connected to an adjacent bitline B/L, and a ferroelectric capacitor FC1 having a first terminal of the two terminals connected to a drain terminal of the transistor T1 and a second terminal of the two terminals connected to the plateline P/L.

The data input/output operation of the conventional FRAM is now described referring to FIGS. 3a and 3b.

FIG. 3a is a timing diagram illustrating a write mode of the FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when an address is decoded in a write mode, a pulse applied to a corresponding wordline transits from a "low" to "high" level, thereby selecting the cell.

In the interval where the wordline WL is held at a high level, a high signal of a predetermined interval and a low signal of a predetermined signal are sequentially applied to a corresponding plateline PL. In order to write binary logic values '1' or '0' in the selected cell, 'high' or 'low' signals synchronized with the write enable signal WEBpad are applied to a corresponding bitline B/L.

In other words, when a high signal is applied to a bitline BL and a low signal is applied to a plateline PL, a logic value "1" is written in the ferroelectric capacitor FC1. When a low signal is applied to a bitline BL and a high signal is applied to a plateline PL, a logic value "0" is written in the ferroelectric capacitor FC1.

FIG. 3b is a timing diagram illustrating a read mode of the FRAM.

Referring to FIG. 3b, when a chip enable signal CSBpad externally transits from a "high" to "low" level, all bitlines are equalized to a "low" level by an equalization signal before a required wordline is selected.

After each bitline is deactivated, an address is decoded to transit a signal on the required wordline from a "low" to "high" level, thereby selecting a corresponding unit cell. A "high" signal is applied to a plateline of the selected cell to destroy a data Qs corresponding to the logic value "1" stored in the FRAM.

If a logic value "0" is stored in the FRAM, its corresponding data Qns will not be destroyed. In this way, the destroyed and non-destroyed data output different values, respectively, according to the above-described hysteresis loop characteristics. As a result, a sense amplifier senses logic values "1" or "0".

In other words, as shown in the hysteresis loop of FIG. 1, the state moves from the 'd' to 'f' when the data is destroyed while the state moves from 'a' to 'f' when the data is not destroyed. As a result, after the lapse of a predetermined time, the sense amplifier is enabled by the sense amplifier enable signal SEN. The sense amplifier outputs a logic value "1" when the data is destroyed, and the sense amplifier outputs a logic value "0" when the data is not destroyed.

After the sense amplifier amplifies and outputs the data, the data should be recovered into the original data. Accordingly, when a "high" signal is applied to the required wordline, the plateline is deactivated from "high" to "low".

A conventional system on a chip 'SOC' structure using the above-described ferroelectric memory automatically separated the memory into an internal region and an external region.

The internal memory region using internal addresses and the external memory region using external addresses are previously set using a physical method on a SOC when address size is determined. For example, if an internal memory has the size of 4K bite, an internal memory is used in an address region of A11, A10, . . . , A0. An external expansion memory is automatically used in an address region having the size of more than 4 K bite.

In other words, once the address size of an internal memory in the SOC is set up, then internal and external address regions are automatically determined. As a result, data of the internal memory cannot be externally outputted via input/output ports in the external address region.

FIG. 4 is a diagram for explaining operations of data input/output port in a dump mode of a conventional SOC.

The dump mode is to sequentially output internal memory data via data input/output port to the outside. In a dump mode, an internal memory data DATA<m−1> is allotted to an internal address ADD<m>. A memory data DATA<m> of the final internal address region ADD<m> is outputted from the next address ADD<m+1>, the first external address. An internal address valid signal ADD_Valid to set a limit of internal address region is effective to the final internal address ADD<m>. Since an address, ADD<m+1> where the final internal memory data DATA<m> is outputted is the external address region ADD<m+1>, the final internal data DATA<m> is not outputted via a data input/output port.

As a result, memory data of the final internal address region in a boundary region between the internal address region and the external address region is not dumped during the internal memory dump mode.

Additionally, a logic for determining the size of memory address and for testing the memory address is realized with a metal option, which is a hardware-connection of metal layers to power lines. When the memory size is changed, a metal mask layer of SOC should be also changed. As a result, the process becomes complicated and the cost increases.

SUMMARY OF THE DISCLOSURE

Accordingly, it is an object of the present invention to make the data in the internal addresses be normally outputted via a data input/output port by allotting external memory region to internal memory region in a dump mode.

It is another object of the present invention to easily change the memory size by programming the memory site using a FRAM code cell.

BRIEF DESCRIPTION OF THE DRAWINGS

The present invention will be described in terms of several embodiments to illustrate its broad teachings. Reference is also made to the attached drawings.

DETAILED DESCRIPTION OF THE PREFERRED EMBODIMENTS

The disclosed nonvolatile ferroelectric memory device includes: a central processing unit for outputting upper addresses determining internal memory size, code program signals and dump test control signals, for receiving dump mode control signals and then outputting internal addresses corresponding to internal memory regions among addresses and internal/external address control signals; a dump mode controller for coding the upper addresses in response to the dump test control signals in a dump mode to allot external memory region to internal memory region and for outputting the dump mode control signals controlling internal address valid signals; and an internal FRAM memory array for controlling internal memory data corresponding to the internal address to be outputted to an input/output port via a data bus, wherein a ferroelectric memory is used for the internal memory.

The present invention will be described in detail with reference to the accompanying drawings.

Figure 1:
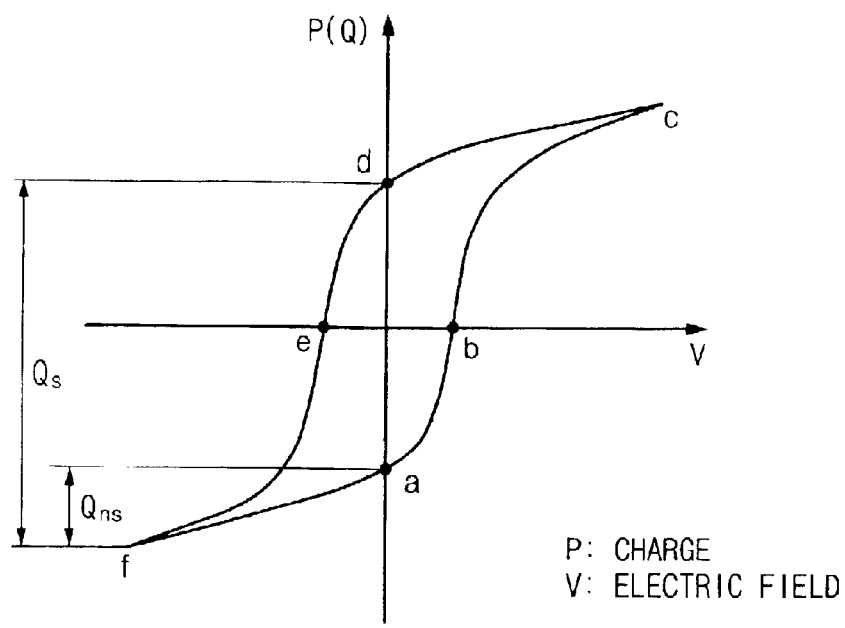
FIG. 1 is a characteristic curve showing a hysteresis loop of a general ferroelectric substance.
Figure 2:
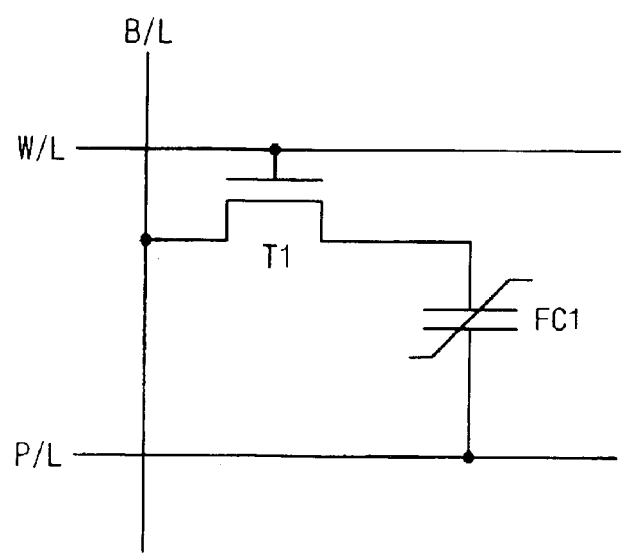
FIG. 2 is a structural diagram showing a unit cell in a conventional nonvolatile ferroelectric memory device.
Figure 3A:
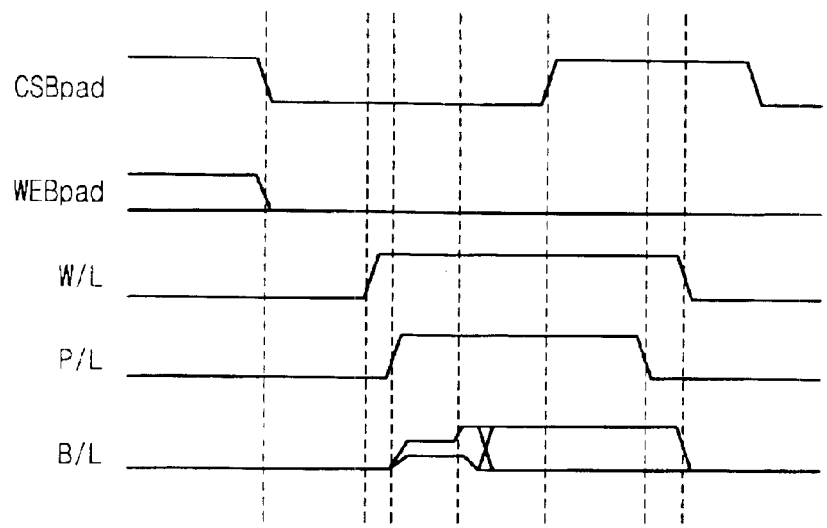
FIG. 3a is a timing diagram showing a write mode operation of a conventional nonvolatile ferroelectric memory device.
Figure 3B:
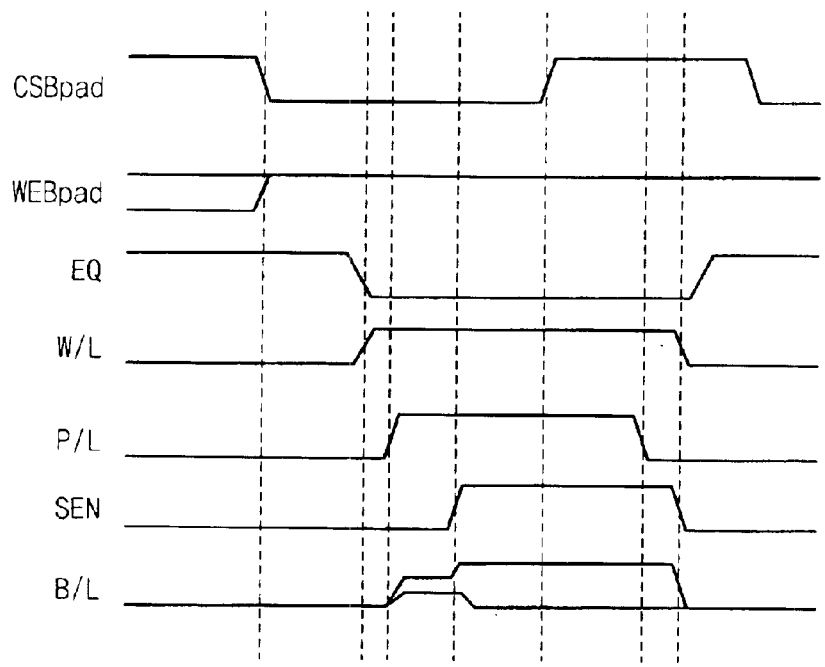
FIG. 3b is a timing diagram showing a read mode operation of a conventional nonvolatile ferroelectric memory device.
Figure 4:
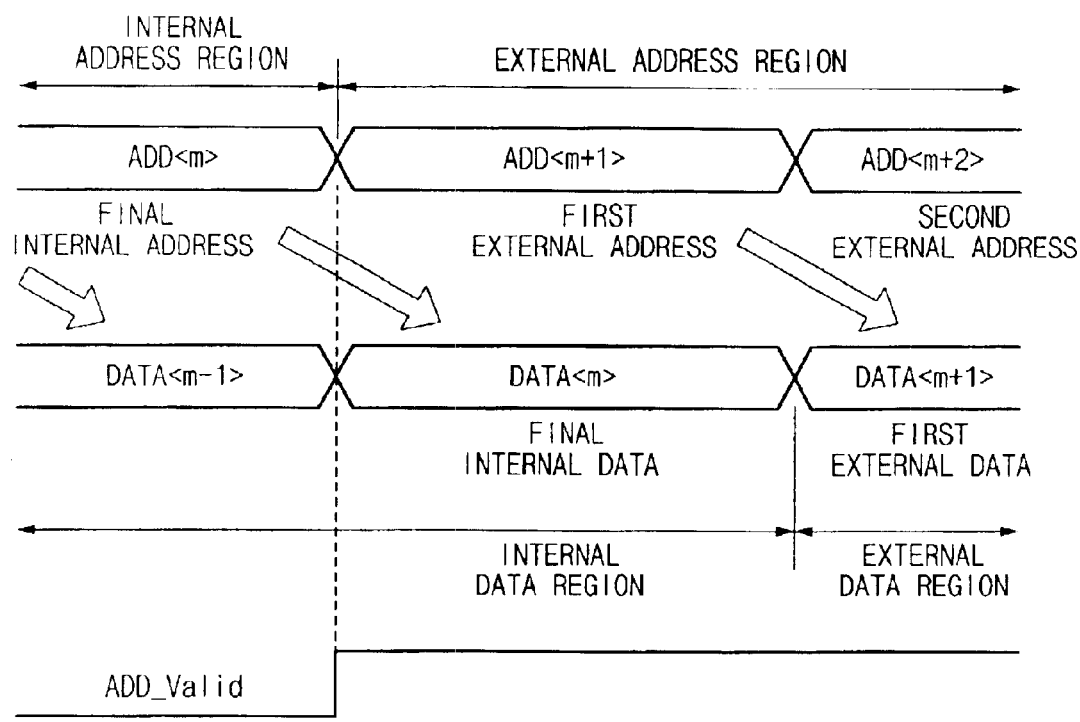
FIG. 4 is a diagram for explaining operations of data input/output port in a dump mode of a conventional SOC.
Figure 5:
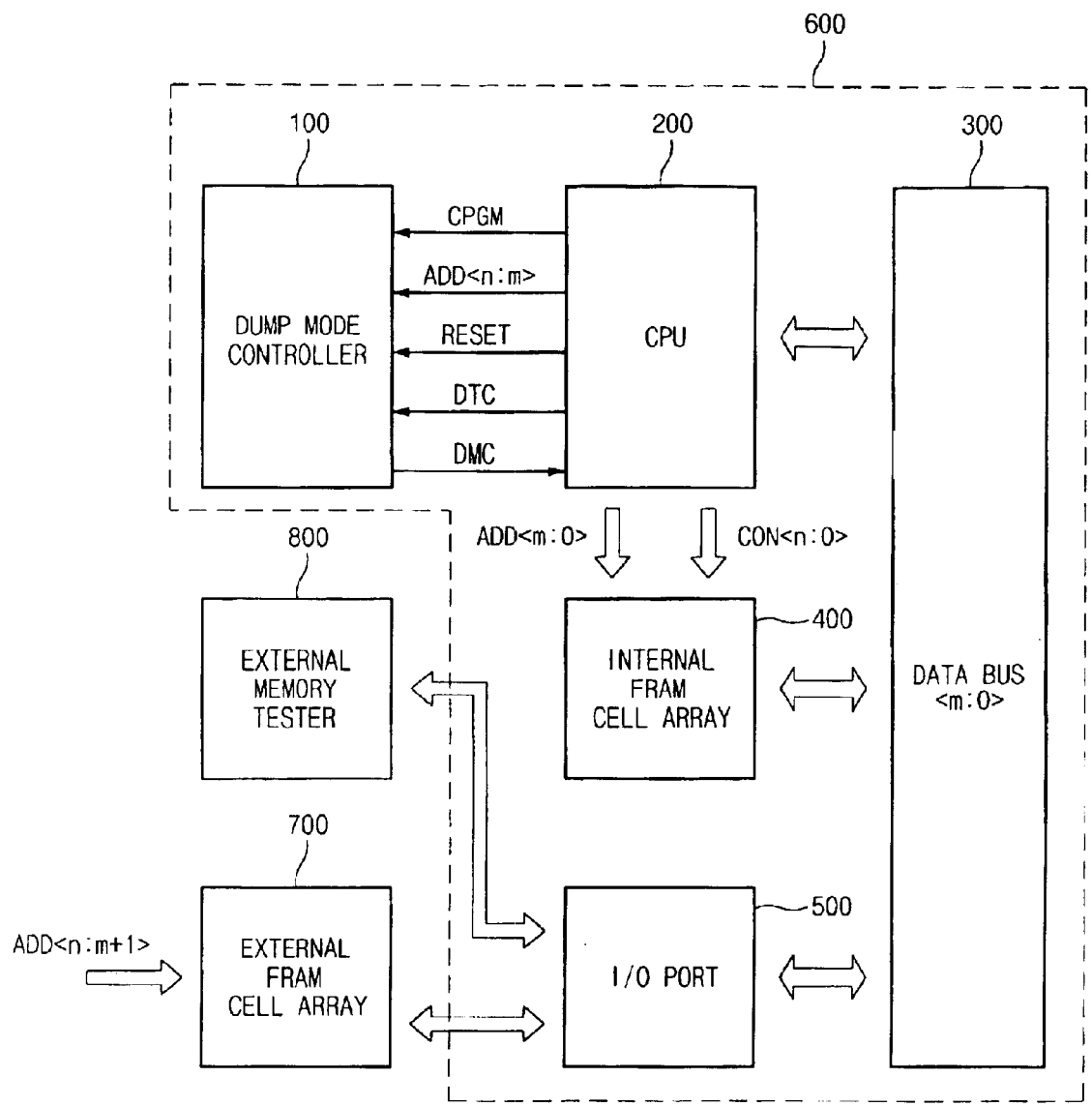
FIG. 5 is a diagram illustrating a structure of a nonvolatile ferroelectric memory control device according to the present invention.

FIG. 5 is a block diagram for explaining a dump test mode in a system on a chip 600 (hereinafter, referred to as 'SOC') of a nonvolatile ferroelectric memory control device according to the present invention.

The SOC 600 comprises a dump mode controller 100, a Central Processing Unit (hereinafter, referred to as 'CPU') 200, a data bus 300, an internal FRAM memory array 400 and an I/O port 500.

The SOC 600 further comprises an external FRAM cell array 700 for testing a dump mode of the SOC 600 and an external memory tester 800.

The dump mode controller 100 outputs a dump mode control signal DMC for controlling a final memory address into the CPU 200.

The CPU 200 outputs a code program signal CPGM, an address ADD<n:m> which is an upper address group to determine the memory size, a power-on reset signal RESET and a dump test control signal DTC into the dump mode controller 100.

The CPU 200 also outputs an internal address ADD<m:0> corresponding to an internal memory region and a control signal for controlling the internal address ADD<m:0> and an external address ADD<n:m+1> into the internal FRAM memory array 400.

An internal memory data <m:0>is outputted via the data bus 300 into the I/O port 500. An external address <n:m+1> applied from the external FRAM cell array 700 is outputted via the I/O port into the data bus 300. The external memory tester 800 for testing a dump mode is connected to the I/O port 500. The data bus 300 is shared by the CPU 200, the internal FRAM memory array 400 and the I/O port 500.

Figure 6:
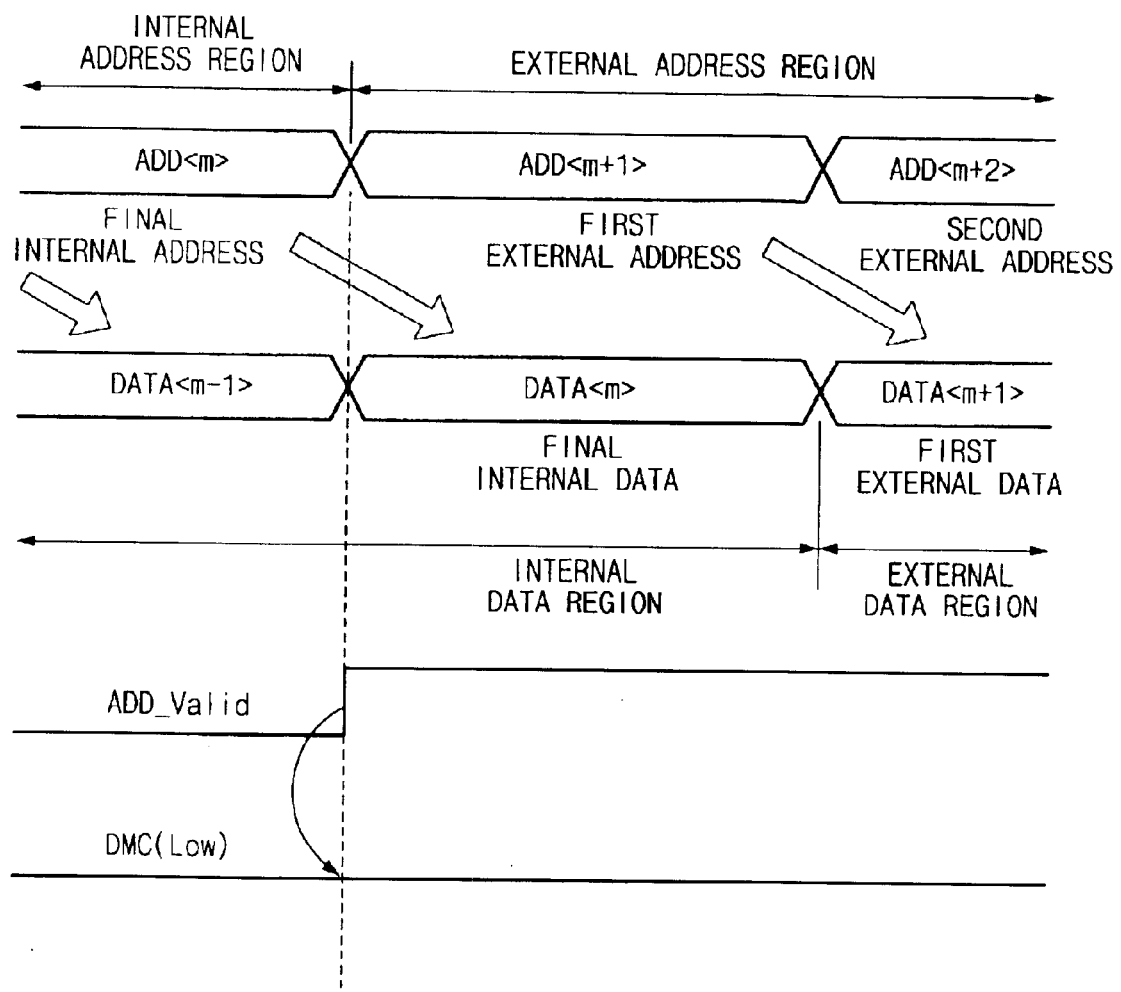
FIG. 6 is a diagram for explaining operations of data input/output port in a dump mode of a nonvolatile ferroelectric memory control device according to the present invention.

FIG. 6 is a diagram for explaining operations of data input/output port in a dump mode of a nonvolatile ferroelectric memory control device according to the present invention.

A final internal data DATA<m> corresponding to a final internal address ADD<m> is outputted via the I/O port 500 in the next external address region. As a result, a final internal data DATA<m> is outputted at the initial external address ADD<m+1>.

Here, an internal address valid signal ADD_Valid is effective until the final address ADD<m>is outputted. The dump mode controller 100 controls the dump mode control signal DMC to be effective to an external address region so that internal memory data may be normally outputted.

Figure 7:
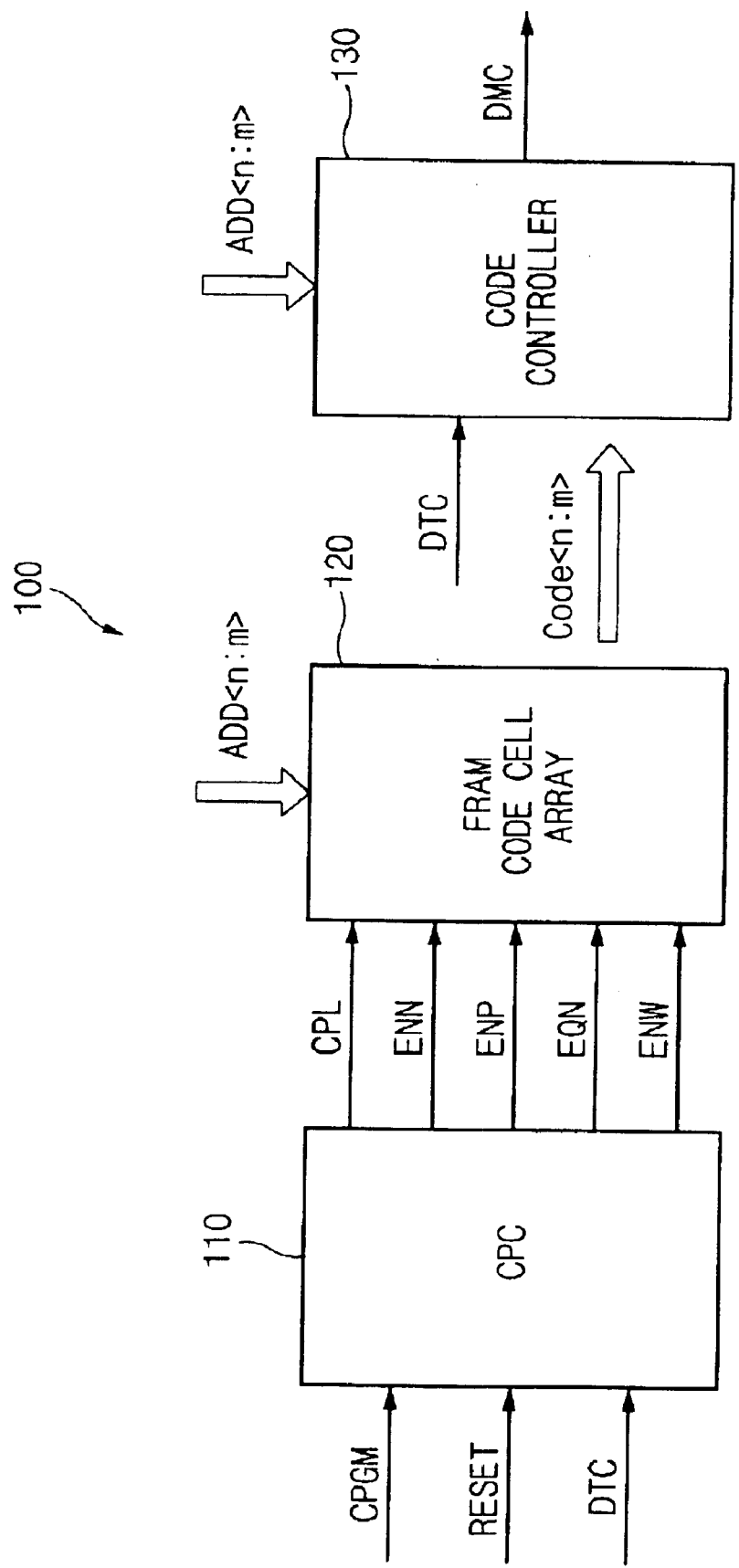
FIG. 7 is a detail block diagram illustrating a dump mode controller of FIG. 5.

FIG. 7 is a detail block diagram illustrating a dump mode controller 100 of FIG. 5.

The dump mode controller 100 comprises a code program controller 110, a FRAM code cell array 120 and a code controller 130.

The code program controller 110 outputs a code program signal CPGM applied from the CPU 200, a cell plate control signal CPL, a pull-down enable signal ENN, a pull-up enable signal ENP, an equalizing signal EQN and a write enable signal ENW. Here, the cell plate control signal CPL is a control signal for coding a code cell of the FRAM code cell array 120 in response to the power-on reset signal RESET and the dump test control signal DTC.

The FRAM code cell array 120 is a circuit to memorize the size of internal memory in a FRAM register by a software method. The FRAM code cell array 120 codes a code cell according to the cell plate control signal CPL applied from the code program controller 110, the pull-down enable signal ENN, the pull-up enable signal ENP, the equalizing signal EQN, the write enable signal ENW, and the upper address ADD<n:m> for determining the memory size and outputs a code signal Code<n:m> into the code controller 130.

The code controller 130 controls to make the dump mode control signal DMC for controlling a data dump mode of internal memory be effective to the external address region according to the code signal Code<n:m> applied from the FRAM code cell array 120, the upper address ADD<n:m> and the dump test control signal DTC.

Figure 8:
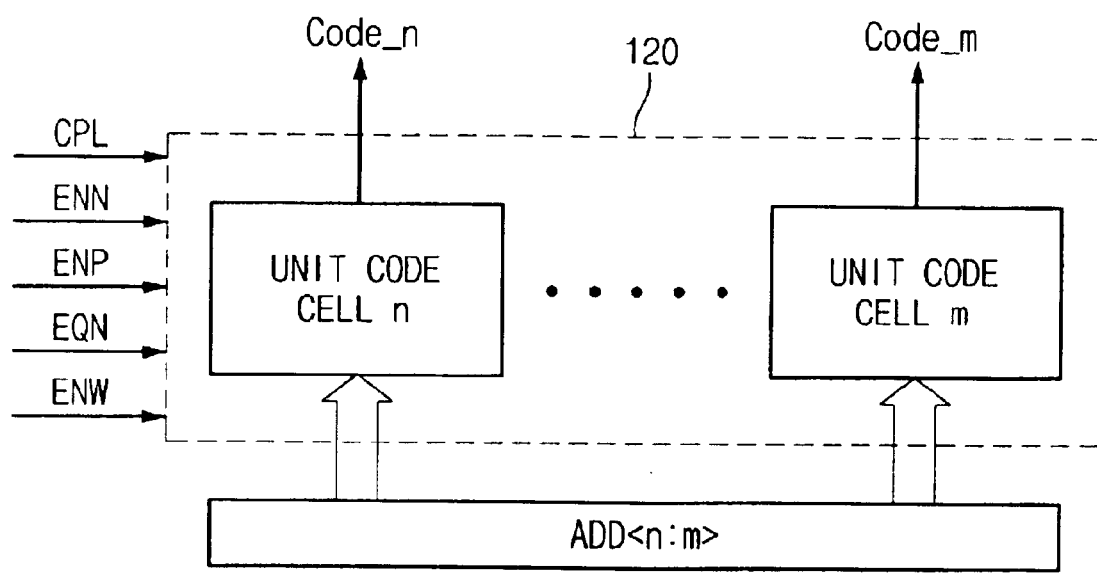
FIG. 8 is a detail block diagram of a FRAM code cell array of FIG. 7.

FIG. 8 is a diagram illustrating a structure of the FRAM code cell array 120 of FIG. 7.

The FRAM code cell array 120 comprises a plurality of unit code cells. Each of the unit code cells memorize the size of internal memory. The plurality of unit code cells code the code cell according to cell plate control signals CPL applied from the code program controller 110, pull-down enable signals ENN, pull-up enable signals ENP, equalizing signals EQN, write enable signals ENW, and upper address ADD<n:m> and output code signals Code_n-Code_m, respectively.

The unit code cells set code cell data so that outputs of code cells corresponding to addresses in the most significant bit 'MSB' region of internal addresses may be constantly '0' and outputs of code cells corresponding to addresses of external addresses may be constantly '1'.

Figure 9:
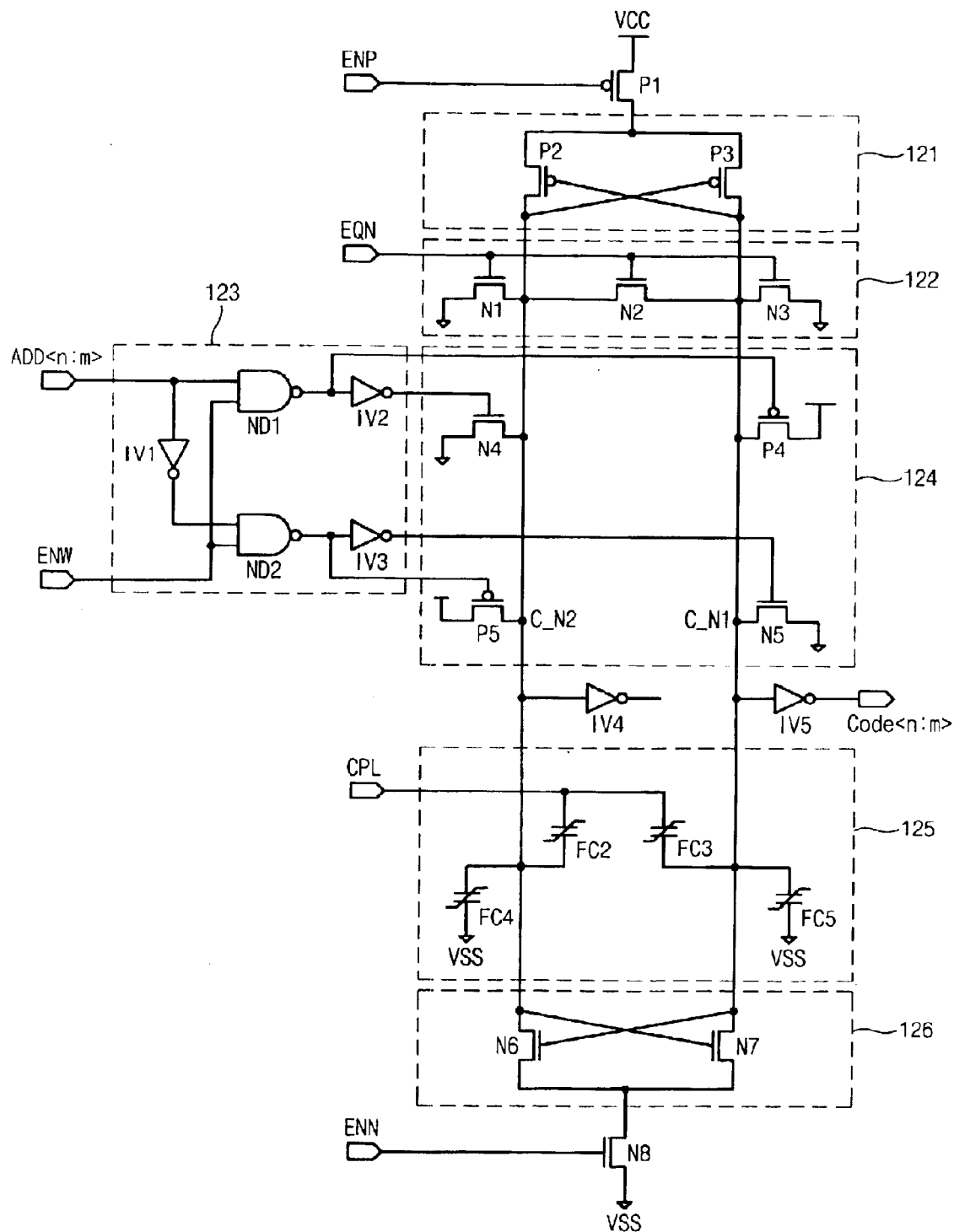
FIG. 9 is a detail circuit diagram of a unit code cell of FIG. 8.

FIG. 9 is a detail block diagram illustrating a FRAM code cell array of FIG. 7.

The unit code cell comprises a pull-up driver 121, an equalizer 122, a logic controller 123, a voltage driver 124, a ferroelectric capacitor unit 125 and a pull-down driver 126.

The pull-up driver 121 comprises a PMOS transistor P1 to supply a power voltage VCC to node C_N1 and C_N2 of both ends of the cell in response to the pull-up enable signal ENP.

The PMOS transistor P1 connected between a power voltage VCC terminal and the common source terminal of PMOS transistors P2 and P3 has a gate to receive a pull-up enable signal ENP.

The pull-up driver 121 comprises PMOS transistors P2 and P3 cross-coupled with the nodes C_N1 and C_N2 of both ends of the cell. The gate of the PMOS transistor P2 is connected to the drain of the PMOS transistor P3 while the gate of the PMOS transistor P3 is connected to the drain of the PMOS transistor P2.

The equalizer 122 comprises NMOS transistors N1, N2 and N3. The NMOS transistors N1 and N2 each connected between nodes C_N1 and C_N2 of both ends of the cell and a ground voltage VSS terminal have a common gate to receive an equalizing signal EQN. The NMOS transistor N3 connected between nodes C_N1 and C_N2 of both ends of the cell have a gate to receive an equalizing signal EQN. When the equalizing signal EQN is applied via the common gate terminal, the NMOS transistors N1-N3 equalize nodes C_N1 and C_N2 of both ends of the cell.

The logic controller 123 logically operates an upper address ADD<n:m> and a write enable signal ENW, and then controls the voltage driver 124 according to the logic operation result.

A NAND gate ND1 NANDs the upper address ADD<n:m> and the write enable signal ENW, and then outputs the output signal into a gate of a PMOS transistor P4. A NAND gate ND2 NANDs the write enable signal ENW and the upper address ADD<n:m> inverted by an inverter IV1, and then outputs the output signal into a gate of a PMOS transistor P5.

An inverter IV2 inverts a signal outputted from the NAND gate ND1, and then outputs the signal into a gate of a NMOS transistor N4. An inverter IV3 inverts a signal outputted from the NAND gate ND2, and then outputs the signal into a gate of a NMOS transistor N5.

The voltage driver 124 selectively drives the NMOS transistors N4 and N5 and the PMOS transistors P4 and P5 according to the logic operation results of the logic controller 123, and then applies a selective voltage to the nodes C_N1 and C_N2 of both ends of the cell.

The ferroelectric capacitor unit 125 comprising ferroelectric capacitors FC2~FC5 generates voltage differences in the nodes C_N1 and C_N2 of both ends of the cell in response to the cell plate control signal CPL.

The ferroelectric capacitor FC2 has a terminal connected to the node C_N2 and another terminal to receive the cell plate control signal CPL. The ferroelectric capacitor FC3 has a terminal connected to the node C_N1 and another terminal to receive the cell plate control signal CPL.

The ferroelectric capacitors FC4 and FC5 each connected to the nodes C_N1 and C_N2 of both ends of the cell and a ground voltage VSS terminal may be selectively added according to loading level control of the nodes C_N1 and C_N2 of both ends of the cell.

The driver 126 comprises NMOS transistors N6 and N7 cross-coupled with the nodes C_N1 and C_N2 of both ends of the cell. The gate of the NMOS transistor N6 is connected to the drain of the NMOS transistor N7. The gate of the NMOS transistor N7 is connected to the drain of the NMOS transistor N6.

The pull-down driver 126 comprises a NMOS transistor N8 to supply a ground voltage VCC to the nodes C_N1 and C_N2 of both ends of the cell in response to the pull-down enable signal ENN.

The NMOS transistor N8 connected between the common source of the NMOS transistors N6 and N7 and a ground voltage VSS terminal has a gate to receive the pull-down enable signal ENN.

An inverter IV5 inverts a signal outputted from the node C_N1, and then outputs a code signal Code<n:m>. An inverter IV4 inverts a signal outputted from the node C_N2, and then outputs the signal into a dummy cell (not shown).

Figure 10:
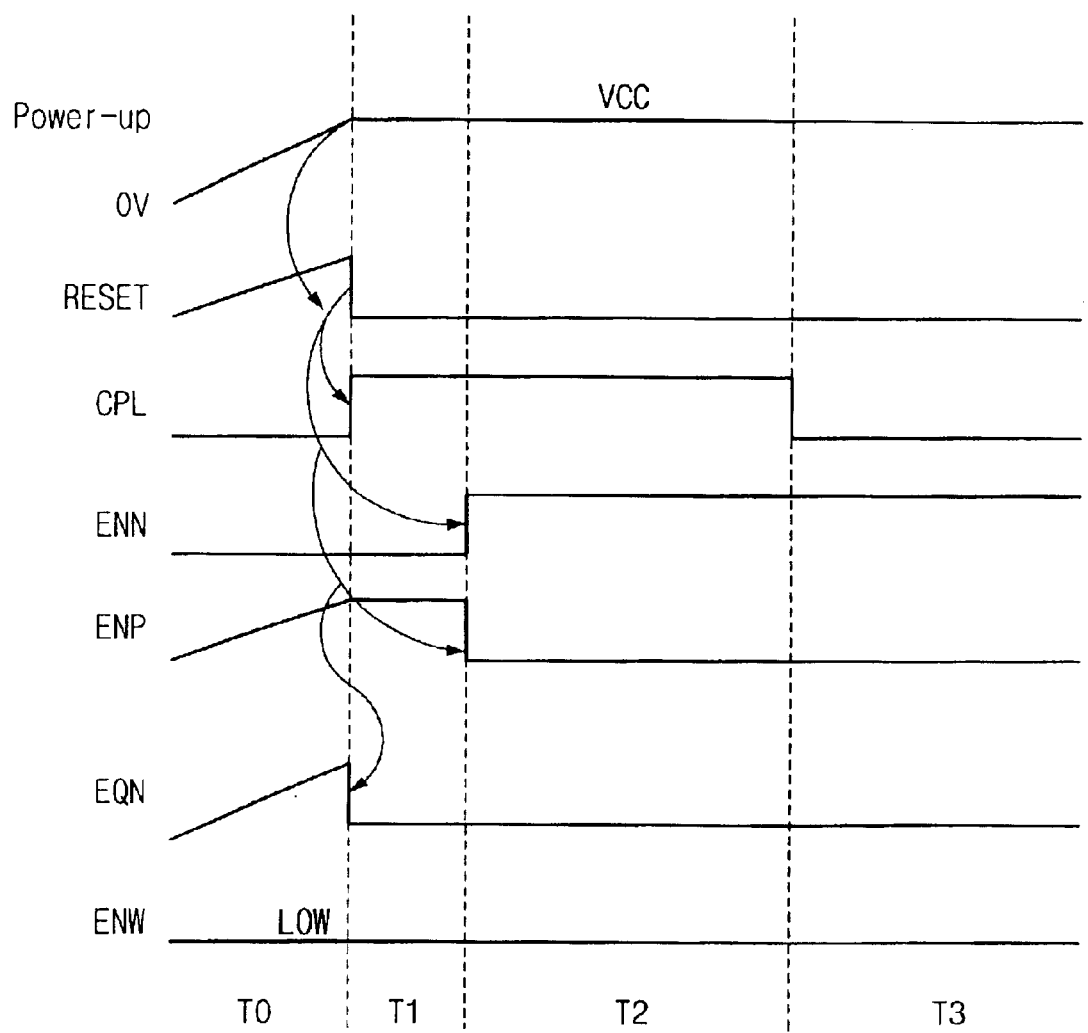
FIG. 10 is a timing diagram illustrating the operation of a code program controller in a power-up mode of FIG. 9.

FIG. 10 is a diagrams illustrating operations wave forms of the control signals in a power-up mode of the unit code cell of FIG. 9.

When a power is supplied initially, data stored in the unit code cell of the FRAM is sensed, and then a read operation is performed.

After the interval T0, if a power voltage VCC reaches a stabilized level, the power-on reset signal RESET is generated.

The code program controller 110 transits the equalizing signal EQN from a high to low level in the interval T1 by using the power-on reset signal RESET to cancel the equalization, and then transits the cell plate control signal CPL from a low to high level.

Thereafter, if the cell plate control signal CPL is enabled to a high level, charges stored in the ferroelectric capacitors FC2 and FC3 of the unit code cell shown in FIG. 8 generate voltage differences in the nodes C_N1 and C_N2 of both ends of the cell by capacitance load of the ferroelectric capacitors FC4 and FC5.

In the interval T2, if enough voltage difference is generated in the nodes C_N1 and C_N2 of both nodes of the cell, the pull-down enable signal ENN is enabled to a high level and the pull-up enable signal ENP is enabled to a low level. As a result, data of both ends of the cell are amplified.

After the data of both ends of the cell are amplified, the cell plate control signal CPL transmits to a low level in the interval T3, and then the destroyed high data of the ferroelectric capacitors FC2 and FC3 are recovered. Here, the write enable signal ENW is disabled to a low level to prevent re-write of external data.

Figure 11:
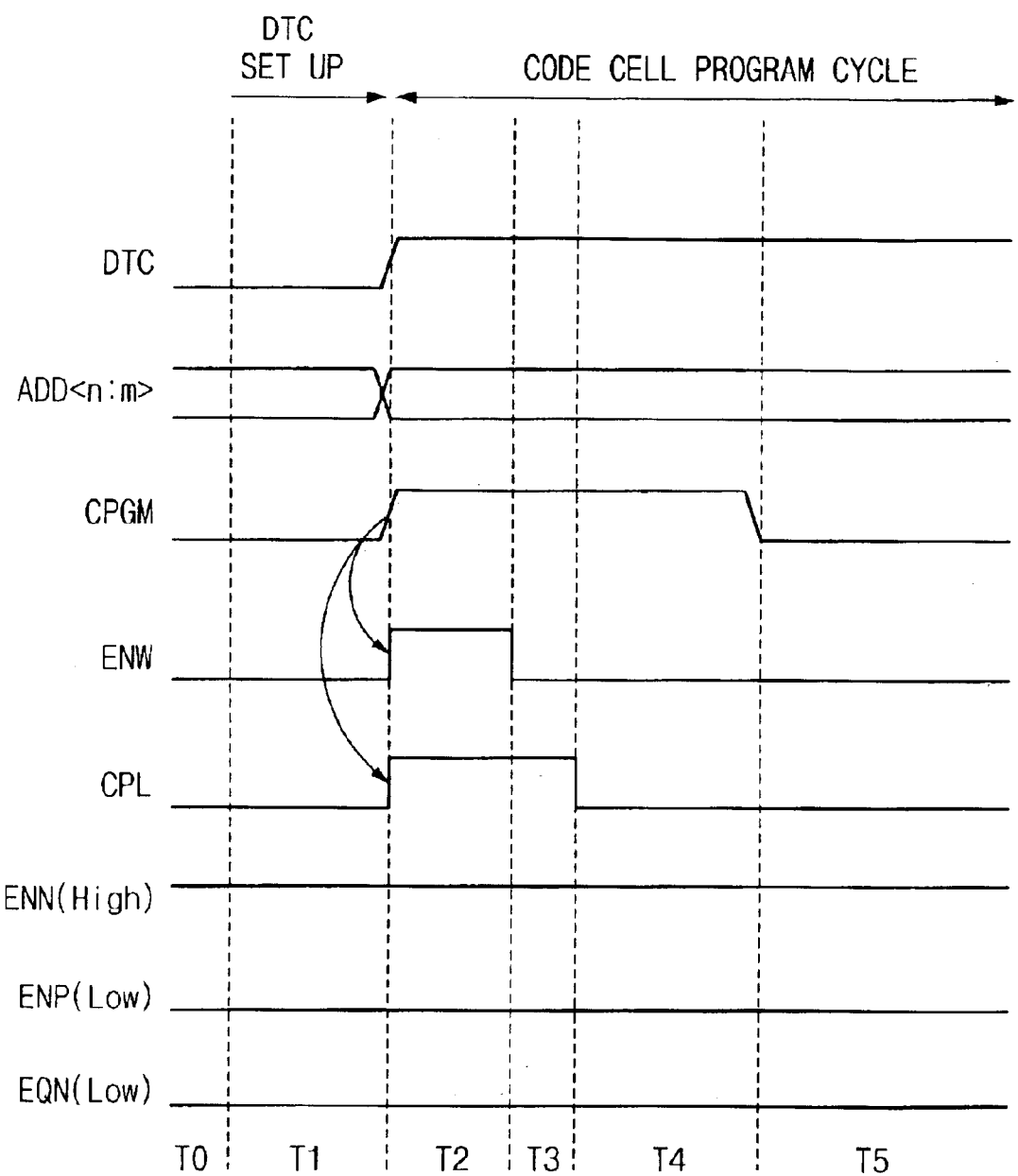
FIG. 11 is a timing diagram of a code cell according to the present invention.

FIG. 11 is a diagram illustrating a code cell program cycle operation in the unit code cell when the dump test control signal DTC is set up.

First, the dump test control signal DTC is set up in the interval T1 after the interval T0, and then a code cell program cycle is started in the interval T2. Here, in the interval T2, when the dump test control signal DTC is enabled to a high level, the code program signal CPGM is enabled. Then, the write enable signal ENW is enabled during the interval T2. The cell plate control signal CPL is enabled during the intervals T2 and T3.

The pull-down enable signal ENN is held at a high level, and the pull-up enable signal ENP and the equalizing signal EQN are held at a low level. As a result, the sense amplifier is activated in the state where the equalization is cancelled, and then the unit code cell can code data.

For example, if the final internal address ADD<m> has a logic value of '1', the node C_N1 is at a high level and the corresponding code signal Code<m> is at a low level. In other words, if the internal address MSB is ADD<m>, when the internal address MSB is '1', the code signal Code<m> is at a low level. As a result, the code signal Code<m> is recognized as an internal address to the internal address. MSB.

Additionally, if the final internal address ADD<m> is '0', the code signal Code<m> is at a high level. As a result, the address ADD<m> is recognized as an external address.

Figure 12:
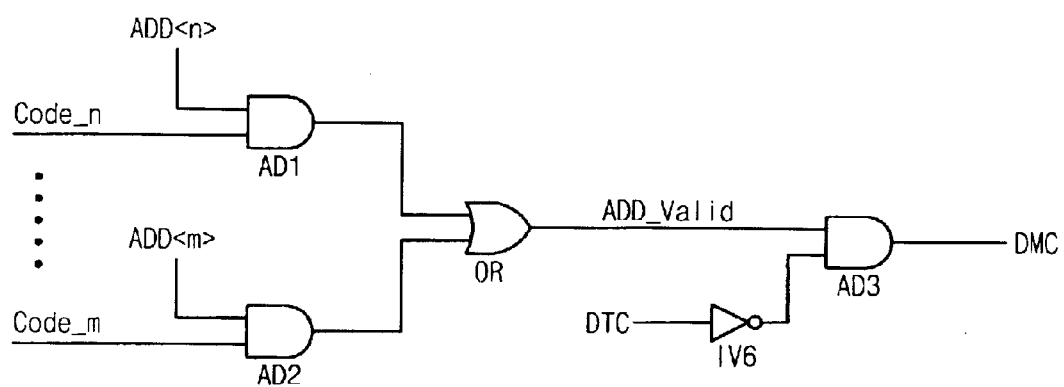
FIG. 12 is a detail circuit diagram illustrating a code controller of FIG. 7.

FIG. 12 is a detail circuit diagram illustrating a code controller 130 of FIG. 7.

The code controller 130 comprises AND gates AD1, AD2 and AD3, and an OR gate OR. The AND gate AD1 ANDs an external address ADD<n> and a code signal Code_n applied from the unit code cell. The AND gate AD2 ANDs an internal address ADD<m> and a code signal Code_m applied from the unit code cell. The OR gate OR ORs signals outputted from the AND gates AD1 and AD2, and then outputs an internal address valid signal ADD_Valid.

The AND gate AD3 ANDs the internal address valid signal ADD_Valid and a dump test control signal DTC inverted by an inverter IV6, and then outputs a dump mode control signal DMC.

The operation process of the code controller 130 is as follows.

If the dump test control signal DTC having a logic value of '0' is in the normal operation mode, when the code signal Code_m has a logic value of '0', the internal address valid signal ADD_Valid also has a logic value of '0' although any signal is inputted into the internal address ADD<m>. Here, the dump mode control signal DMC has a logic value of '0' and then operates in an internal memory mode.

When the internal address ADD<m> has a logic value of '0' in the state where the code signal Code_m has a logic value of '1', the dump mode control signal DMC has a logic value of '0' and then operates in an external memory mode. If the internal address ADD<m> has a logic value of '1', the dump mode control signal DMC has a logic value of '1' and then operates in an external memory mode.

When the dump test control signal DTC of a high level is in an internal memory dump mode, the dump mode control signal DMC has a logic value of '0' regardless of the code signal Code_m and the internal address ADD<m>. Accordingly, since all memory addresses are operated into internal address modes, the code controller 130 controls internal memory data to be normally dumped into external I/O ports As discussed earlier, all internal addresses may be normally outputted via data I/O ports because external memory regions are allotted to internal memory regions in a dump mode.

Additionally, the memory size may be easily changed in the outside because the memory address size can be programmed using a FRAM code cell, thereby reducing the process cost.

What is claimed is:

1. A nonvolatile ferroelectric memory control device comprising: a central processing unit for outputting upper addresses determining internal memory size, code program signals, and dump test control signals, for receiving dump mode control signals, and for outputting internal addresses corresponding to internal memory regions among addresses and internal/external address control signals; a dump mode controller for coding the upper addresses in response to the dump test control signals in a dump mode to allot external memory region to internal memory regions and then outputting the dump mode control signals controlling internal address valid signals; and an internal FRAM memory array for controlling internal memory data corresponding to the internal address to be outputted via a data bus into an input/output port, wherein a ferroelectric memory is used for the internal memory.

2. The device according to claim 1, wherein the dump mode controller comprises: a code program controller for outputting control signals coding FRAM code cells in response to the code program signals storing the size of the internal memory, power-on reset signals and the dump test control signals; a FRAM code cell array for outputting code signals storing the size of the internal memory in the FRAM code cell according to the state of the control signals; and a code controller for selectively outputting the dump mode control signals according to the state of the dump mode control signals.

3. The device according to claim 2, wherein the control signals is a cell plate control signal, a pull-up enable signal, a pull-down enable signal, an equalizing signal and a write enable signal.

4. The device according to claim 3, wherein the FRAM code cell array comprises a plurality of unit code cells for outputting code signals corresponding to the upper addresses according to the state of the control signals.

5. The device according to claim 4, wherein the plurality of unit code cells comprises: a pull-up driver for applying a power voltage to both ends of a cell in response to the pull-up enable signal; a pair of PMOS transistors and a pair of NMOS transistors cross-coupled with both ends of a cell; an equalizer for equalizing voltages of both ends of the cell in response to the equalizing signal; a logic controller for logically operating the upper address and the write enable signal; a voltage driver for applying a selective voltage to both ends of the cell according to the result of the logic controller; a ferroelectric capacitor unit for generating voltage difference in both ends of the cell in response to the cell plate control signal; and a pull-down driver for applying a ground voltage to both ends of the cell in response to the pull-down enable signal.

6. The device according to claim 5, wherein the equalizer comprises: a first and a second NMOS transistors each connected between nodes of both ends of the cell and a ground terminal and having each gate to receive the equalizing signal; and a third NMOS transistor connected between both ends of the cell and having a gate to receive the equalizing signal.

7. The device according to claim 5, wherein the logic controller comprises: a first NAND gate for NANDing the upper address and the write enable signal; a second NAND gate for NANDing the write enable signal and the upper address inverted by a first inverter; a second inverter for inverting and outputting a signal outputted from the first NAND gate; and a third inverter for inverting and outputting a signal outputted from the second NAND gate.

8. The device according to claim 7, wherein the voltage driver comprises: a fourth NMOS transistor connected between a first node of the cell and a ground voltage and having a gate to receive a signal outputted from the second inverter; a first PMOS transistor connected between a second node of the cell and a power voltage and having a gate to receive a signal outputted from the first NAND gate; a second PMOS transistor connected between a first node of the cell and a power voltage and having a gate to receive a signal outputted from the second NAND gate; and a fifth NMOS transistor connected between a second node of the cell and a ground terminal and having a gate to receive a signal outputted from the third inverter.

9. The device according to claim 5, wherein the ferroelectric capacitor unit comprises first and second ferroelectric capacitors each having a first terminal connected to both ends of the cell and a second terminal to receive the plate control signal in common.

10. The device according to claim 9, wherein the ferroelectric capacitor unit further comprises third and fourth ferroelectric capacitors connected between both ends of the cell and a ground voltage terminal.

11. The device according to claim 4, wherein the FRAM code cell array sets unit code cell data in order that outputs of unit code cell corresponding to an address in the most significant bit of the internal addresses may be different from those of unit code cell corresponding to an external address.

12. The device according to claim 2, wherein the code controller comprises: a first logic unit for logically operating the code signals each corresponding to the upper addresses; a second logic unit for logically operating signals outputted from the first logic unit and outputting the internal address valid signals; and a third logic unit for logically operating the internal address valid signals and the inverted dump test control signals and then outputting the dump mode control signals.

13. The device according to claim 12, wherein the first logic unit comprises a plurality of AND gates for ANDing code signals corresponding to internal addresses.

14. The device according to claim 12, wherein the second logic unit comprises an OR gate.

15. The device according to claim 12, wherein the third logic unit comprises an AND gate device.

16. A nonvolatile ferroelectric memory control device in a system-on-chip structure comprising a nonvolatile ferroelectric register and a programmer for programming the nonvolatile ferroelectric register to change the stored address size and then setting a valid internal address when configuring regions of internal and external addresses, said programmer allotting external memory regions to internal memory regions in a dump mode.

17. The device according to claim 16, wherein the programmer comprises: a FRAM code cell array for outputting code signals corresponding to upper addresses to store size of internal memory; and a code controller for logically operating the upper addresses and the code signals corresponding to the upper addresses to output internal address valid signals setting valid internal address regions and then outputting the output signals held at low level regardless of the internal address valid signals when a first control signal is inputted.

18. The device according to claim 17, wherein the first control signal is a dump test control signal enabled in a dump mode test.

19. The device according to claim 17, wherein the FRAM code cell array comprises a plurality of code cells for outputting code signals corresponding to the upper addresses according to the states of second control signals.

20. The device according to claim 19, wherein the second control signals are a cell plate control signal, a pull-up enable signal, a pull-down enable signal, an equalizing signal and a write enable signal.

21. The device according to claim 20, wherein the plurality of unit code cells comprise: a pull-up driver for applying power voltages to both ends of a cell in response to the pull-up enable signal; a pair of PMOS transistors and a pair of NMOS transistors cross-coupled with both ends of the cell; an equalizer for equalizing voltages of both ends of the cell in response to the equalizing signal; a logic controller for logically operating the upper address and the write enable signal; a voltage driver for applying a selective voltage to both ends of the cell according to the result of the logic controller; a ferroelectric capacitor unit for generating a voltage difference in both ends of the cell in response to the cell plate control signal; and a pull-down driver for applying ground voltages to both ends of the cell in response to the pull-down enable signal.

22. The device according to claim 21, wherein the equalizer comprises: a first and a second NMOS transistors each connected between both ends of the cell and a ground terminal and having gates to receive the equalizing signal; and a third NMOS transistor connected between both ends of the cell and having a gate to receive the equalizing signal.

23. The device according to claim 21, wherein the logic controller comprises: a first NAND gate for NANDing the upper address and the write enable signal; a second NAND gate for NANDing the write enable signal and the upper address inverted by a first inverter; a second inverter for inverting and outputting a signal outputted from the first NAND gate; and a third inverter for inverting and outputting a signal outputted from the second NAND gate.

24. The device according to claim 21, wherein the voltage driver comprises: a fourth NMOS transistor connected between a first node of the cell and a ground terminal and having a gate to receive a signal outputted from the second inverter; a first PMOS transistor connected between a second node of the cell and a power voltage and having a gate to receive a signal outputted from the first NAND gate; a second PMOS transistor connected between a first node of the cell and a power voltage and having a gate to receive a signal outputted from the second NAND gate; and a fifth NMOS transistor connected between a second node of the cell and a ground terminal and having a gate to receive a signal outputted from the third inverter.

25. The device according to claim 21, wherein the ferroelectric capacitor unit comprises a first and a second ferroelectric capacitors each having one terminal connected to both ends of the cell and another terminal to receive the plate control signal in common.

26. The device according to claim 25, wherein the ferroelectric capacitor unit further comprises a third and fourth capacitors each connected between both ends of the cell and a ground voltage terminal.

27. The device according to claim 19, wherein the FRAM code cell array sets unit code cell data in order that outputs of unit code cell corresponding to an address in the most significant bit of the internal addresses may be different from those of unit code cell corresponding to an external address.

28. The device according to claim 17, wherein the code controller comprises: a first logic unit for logically operating the code signals corresponding to the upper addresses, respectively; a second logic unit for logically operating outputs of the first logic unit and then outputting the internal address valid signals; a third logic unit for logically operating the internal address valid signal and the inverted first control signal and then outputting the dump mode control signal.

29. The device according to claim 28, wherein the first logic unit comprises a plurality of AND gates for ANDing code signals corresponding to internal addresses.

30. The device according to claim 28, wherein the second logic unit comprises an OR gate.

31. The device according to claim 28, wherein the third logic unit comprises an AND gate device.

* * * * *